US005495393A

United States Patent [19]

Inoue et al.

[11] Patent Number: 5,495,393

[45] Date of Patent: Feb. 27, 1996

[54] ELECTRONIC APPARATUS HAVING A SWITCHING MECHANISM WITH A CONDUCTIVE PATTERN DISPOSED ON A SUBSTRATE SIDE

[75] Inventors: Takayo Inoue; Hisao Nakamura, both of Tokyo, Japan

[73] Assignee: Seiko Instruments Inc., Japan

[21] Appl. No.: 264,013

[22] Filed: Jun. 22, 1994

[30] Foreign Application Priority Data

| | | | |
|---|---|---|---|
| Jun. 28, 1993 | [JP] | Japan | 5-035022 U |
| Apr. 15, 1994 | [JP] | Japan | 6-077647 |

[51] Int. Cl.[6] .................... H05K 1/00; H01H 1/10

[52] U.S. Cl. .................... 361/752; 361/781; 200/512; 200/517

[58] Field of Search .................... 200/512, 517; 361/752, 778, 781

[56] References Cited

U.S. PATENT DOCUMENTS

| | | | |
|---|---|---|---|
| 3,911,233 | 10/1975 | Nakamura et al. | 200/517 |
| 4,029,916 | 6/1977 | Chu | 200/517 |
| 4,117,292 | 9/1978 | Hayes et al. | 200/517 |
| 4,304,972 | 12/1981 | Fenelle et al. | 200/517 |
| 4,343,975 | 8/1982 | Sado | 200/314 |
| 4,360,722 | 11/1982 | Georgopulos | 200/314 |
| 4,408,901 | 10/1983 | Gagnebin | 368/321 |
| 4,439,647 | 3/1984 | Calandrello et al. | 200/5 A |
| 4,659,879 | 4/1987 | Hasegawa | 200/5 A |

FOREIGN PATENT DOCUMENTS

| | | |
|---|---|---|
| 0030696 | 6/1981 | European Pat. Off. . |
| 0423924 | 4/1991 | European Pat. Off. . |
| 3007005 | 6/1983 | Germany . |
| 4117771 | 12/1992 | Germany . |
| 2050695 | 1/1981 | United Kingdom . |

*Primary Examiner*—Bot L. Ledynh
*Attorney, Agent, or Firm*—Adams & Wilks

[57] ABSTRACT

An electronic apparatus comprises a case having a main surface and a side surface, and an operating member mounted on the side surface of the case for operating a switch function associated with the electronic apparatus. A substrate having a main surface and a side surface is disposed within the case. A printed wiring circuit is disposed on the main surface of the substrate. First and second conductive patterns are disposed in spaced relationship from each other on the side surfaces of the Substrate and are connected to the printed wiring circuit. An elastic insulating member having first and second surfaces is disposed between the substrate and the operating member. A conducting element is fixedly attached to the first surface of the insulating member in facing and spaced apart relationship to the first and second conductive patterns. Upon depression of the operating member, the operating member contacts the second surface of the insulating member which undergoes flexure and moves the conducting element into contact with the first and second conductive patterns on the side surface of the substrate.

15 Claims, 9 Drawing Sheets

ELECTRONIC APPARATUS HAVING A SWITCHING MECHANISM WITH A CONDUCTIVE PATTERN DISPOSED ON A SUBSTRATE SIDE

The present invention relates to an electronic apparatus having a switching mechanism for switching with an elastic member and to a manufacturing method of an electronic apparatus having a switching mechanism.

As shown in FIG. 8, in the prior art, an external operating member 13 is retained by a case 14 and incorporated into the same so as to be pushed and spring back after releasing a push. When the external operating member 13 is pushed, the tip thereof presses a conductive elastic member 12, so as to conduct to a pattern 11*a* of a substrate 11.

When pressure of the external operating member 13 is released, the conductive elastic member 12 returns to the original position because of spring pressure of a coil spring 17.

It is conventionally known that the pattern 11*a* of the substrate 11 is electrically conducted to the conductive elastic member 12 and supports the same as seen from the publication of the utility patent laid open JP-U-B-53-62675(1978).

Furthermore, an electric timepiece, as shown in FIG. 9 and FIG. 10, in which an external operating member 23, a conductive elastic member 22, and substrate patterns 21*a* and 21*b* are all disposed with a display element 24 is known in the prior art.

However, in the conventional switching mechanism as shown in FIG. 8, when the external operating member 13 is pushed while the static electricity is generated, the static electricity flows from the pattern 11*a* of the substrate 11 to an IC 18 through the conductive elastic member 12, which results in malfunction of the IC 18.

In an electronic apparatus in which a switch is disposed at the front of the electronic apparatus as shown in FIG. 9 and 10, the area for the display element is reduced because the switch is provided at the front of the electronic apparatus. Therefore, arises in a problem arises in that it is hard to read the information displayed.

SUMMARY OF THE INVENTION

Among the objects of the present invention are to prevent the static electricity generated outside of the electronic apparatus from flowing into an IC, to realize a switching mechanism provided at the side of the electronic apparatus in order to widen the display element as much as possible, and to obtain a forming method of a side pattern employed to the switching mechanism.

For solving the aforementioned problem, the inventive electronic apparatus having a switching function is so constructed that a first conductive side pattern and a second conductive side pattern are formed in a substrate, an external operating member is disposed at the side of the electronic apparatus, a conducting element and an insulating member are provided respectively on the side of the side patterns and on the side of the external operating member between the side patterns and the external operating member so as to form a unified elastic member.

With respect to a manufacturing method of the first side pattern and the second side pattern to be formed on a substrate, another step is added to divide the side pattern after a step of forming the side pattern.

In an electronic apparatus having a switching function constructed as stated above, when the external operating member is pushed the tip of the external operating member and presses the insulating member, result as a result the conducting member conducts to the first side pattern and the second side pattern formed on the substrate.

In this case, when the external operating member is pushed while the static electricity is generated therein, such static electricity of the external operating member is blocked by the insulating member so as to not flow into the conducting member and the side pattern so that inflow of the static electricity to the IC may be prevented.

A flow chart of a typical manufacturing method of the side pattern of the substrate in the present invention is shown in FIG. 5.

In FIG. 5, a pattern forming step is to form a pattern on the substrate by etching (Step 501). A through hole boring step is for making a through hole. (Step 502).

A through hole plating step is to form a metal surface by electroless plating at the internal circumference of a bore formed in the boring step (Step 503).

A cutting step is to cut a completed through hole so as to expose the metal surface of the internal circumference of a through hole to the outside (Step 504).

A dividing step is to divide the side pattern for forming the first side pattern and the second side pattern after a step of forming a side pattern (Step 505).

This dividing step makes it possible to form a plurality of side patterns which is not provided plurally in the prior art. In addition, according to the inventive manufacturing method of a side pattern, a plurality of the side patterns are formed which are adjacent to each other.

DETAILED DESCRIPTION OF THE PREFERRED EMBODIMENTS

Figure 1:
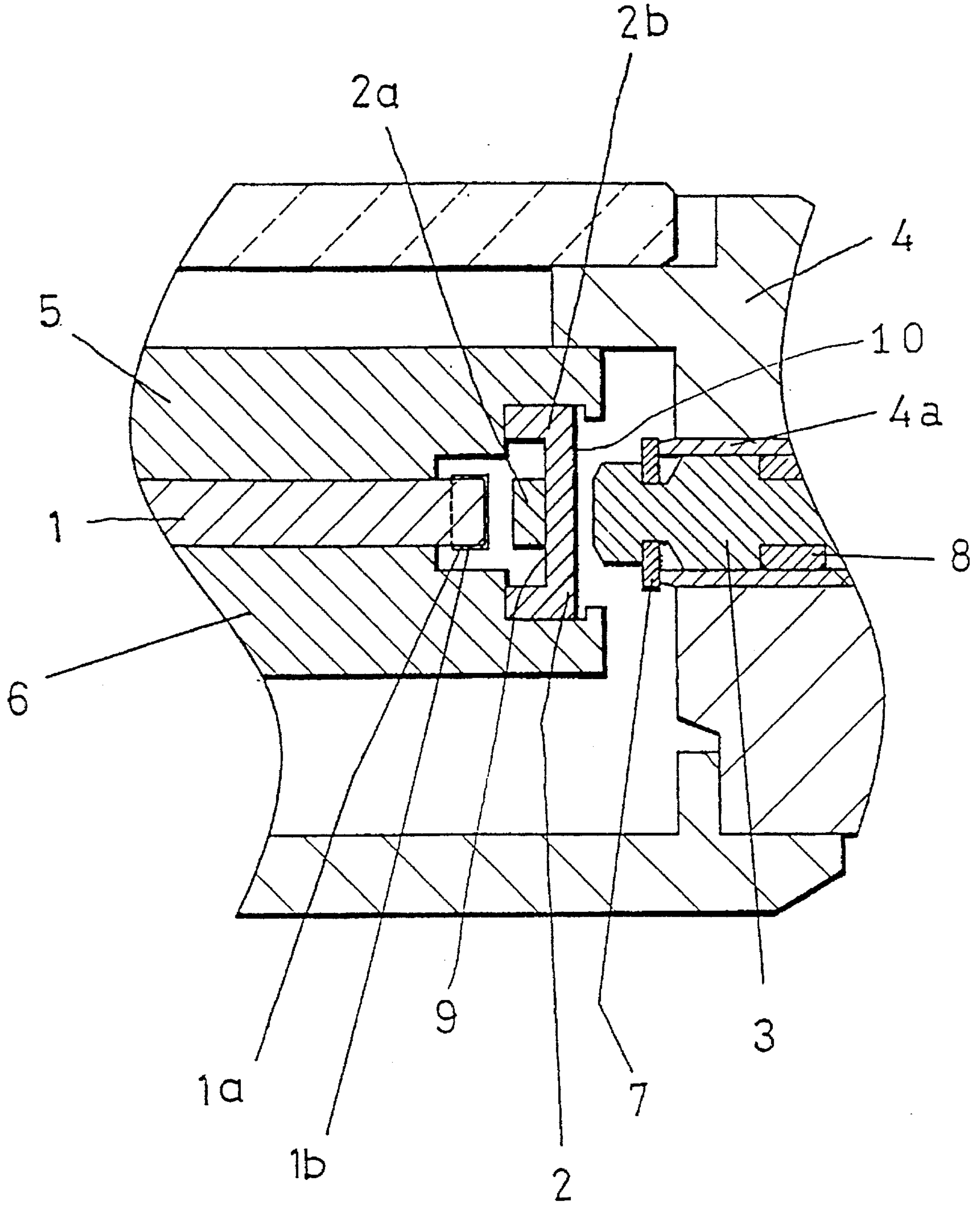
FIG. 1 is a cross section of an embodiment of the inventive electronic apparatus having a switching mechanism.

An embodiment of the inventive electronic apparatus having a switching mechanism will be explained hereinafter referring to the drawings.

Figure 2:
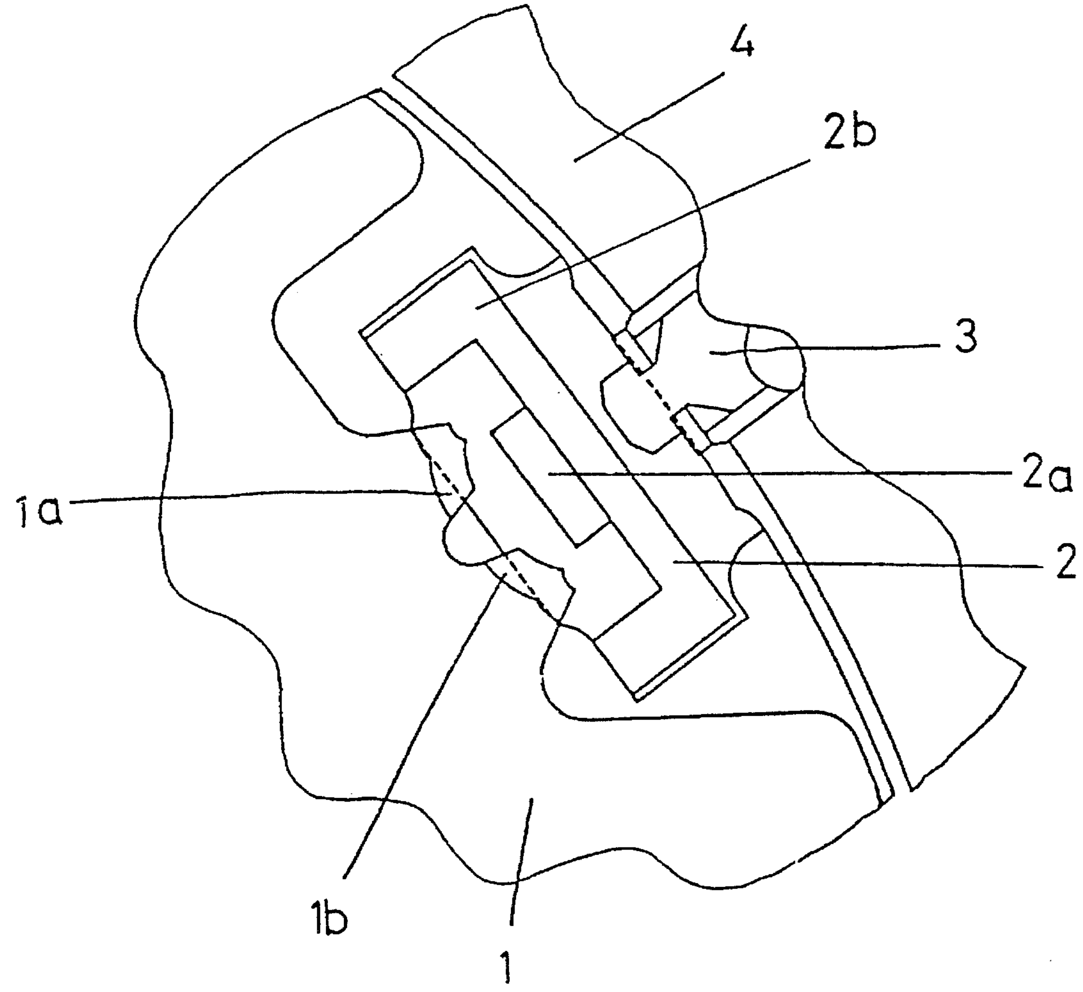
FIG. 2 is plane view showing an embodiment of the inventive electronic apparatus having a switching mechanism.

In FIGS. 1 and 2, a switch pattern 1*a* is preferably used as a first conductive side pattern and a ground pattern 1*b* is preferably used as a second conductive side pattern.

The first or the second side pattern may be connected to an electric potential of the plus side of an IC (not shown).

A pipe 4*a* is provided at the side of a support member or case 4. An external operating member 3 is inserted slidably into the pipe 4*a*. In order to prevent the pipe from falling out from the case 4, a stopping ring 7 is provided at the tip of the external operating member 3.

Then, in order to keep a water-resistant characteristic, a sealing member or gasket 8 is mounted between the outer operating member 3 and the pipe 4*a*. The case 4 guides the external operating member 3. When a pushing force on the external operating member 3 is released, the external operating member 3 returns to the previous position by the spring force of a coil spring 17.

A substrate 1 includes the switch pattern 1*a* and the ground pattern 1*b*. An elastic member 2 is disposed between the substrate 1 and the external operating member 3.

The elastic member 2 is obtained by disposing a conducting element 2*a* on the side of the switch pattern 1*a* or the ground pattern 1*b* and disposing an insulating member 2*b* on the side of the outer operating member 3 so as to unify them. That is, the conducting element 2*a* is fixedly attached to a first surface 9 of the insulating member 2*b*, and in facing and spaced apart relationship with the first and second side patterns 1*a*,1*b*. A second surface 10 of the insulating member 2*b* is in facing and spaced apart relationship with the operating member 3.

The switch pattern 1*a* and the ground pattern 1*b* are manufactured in accordance with a single through hole. The switch pattern 1*a* and the ground pattern 1*b* are formed by processing the outline and dividing into two. The patterns are located at the side of the outer circumference so as to be exposed to the outside.

The switch pattern 1*a* is disposed as that of a circuit formed on a circuit substrate. The ground pattern 1*b* is connected to a ground line of a circuit formed on a circuit substrate.

The elastic member 2 is retained by a support member 5 and a support member 6 so as to face the switch pattern 1*a* and the ground pattern 1*b* provided to the substrate 1.

Next, operations of the inventive electronic apparatus having a switching mechanism will be explained referring to FIG. 3.

When the external operating member 3 is pushed, the tip thereof presses the insulating member 2*b*. The conducting element 2*a* conducts to the switch pattern 1*a* and the ground pattern 1*b* formed on the substrate 1.

When the external operating member 3 is pushed while the static electricity is generated, the static electricity doesn't flow from the switch pattern 1*a* and the ground patter 1*b* into an IC provided on the substrate 1 (and hidden from the view), because the insulating member 2*b* blocks the static electricity.

The material for the insulating member 2*b* should be elastic, like silicon rubber, and the shape of which could be formed.

The material for the conducting element 2*a* should be preferably silicon rubber including a conductive material such as carbon, however a metal piece is also effective.

Figure 4:
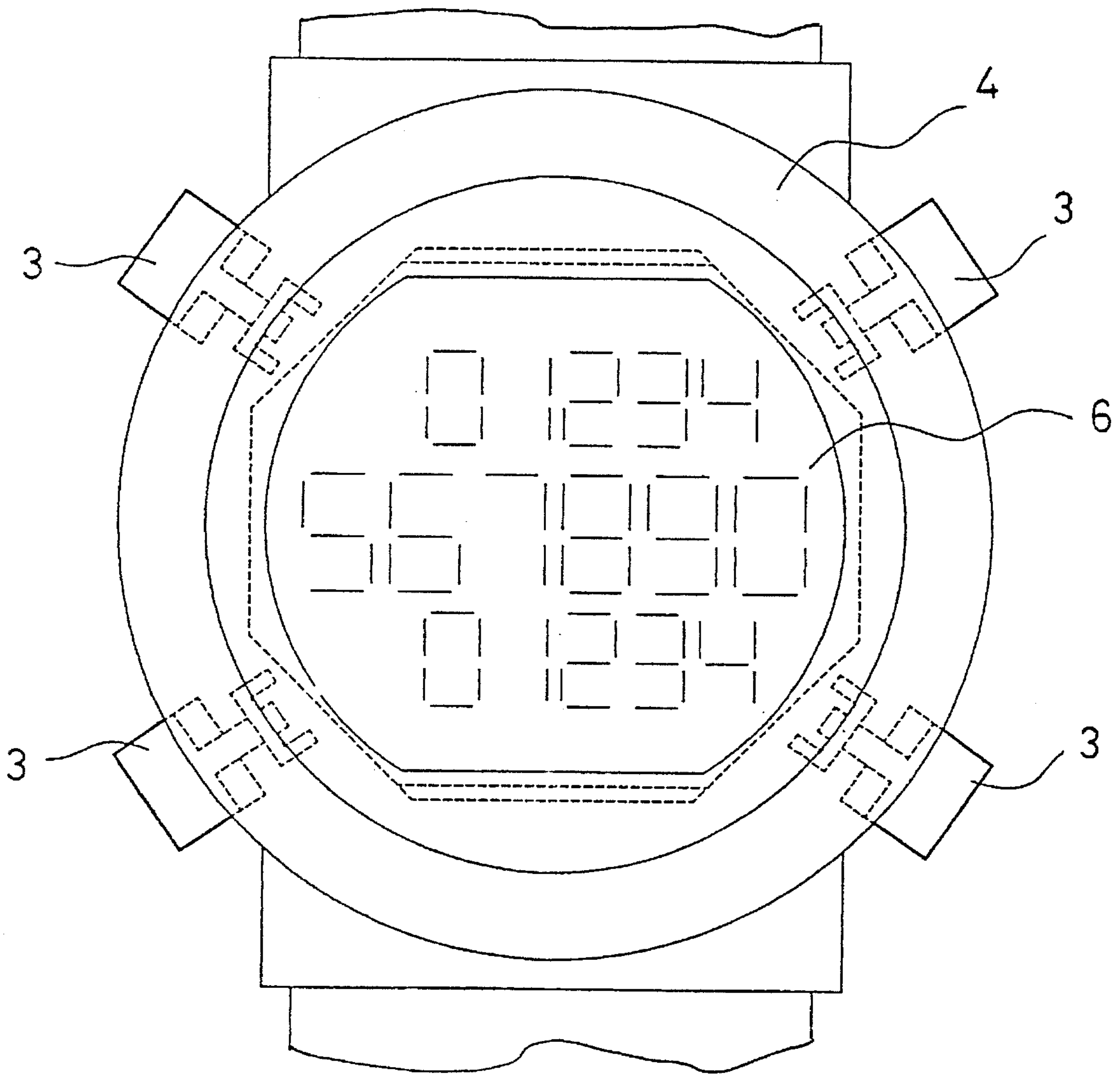
FIG. 4 is a plane view showing an embodiment of the inventive electronic apparatus having a switching mechanism.

FIG. 4 is a plan view showing an embodiment of the inventive electronic apparatus having a switching mechanism.

Figure 3:
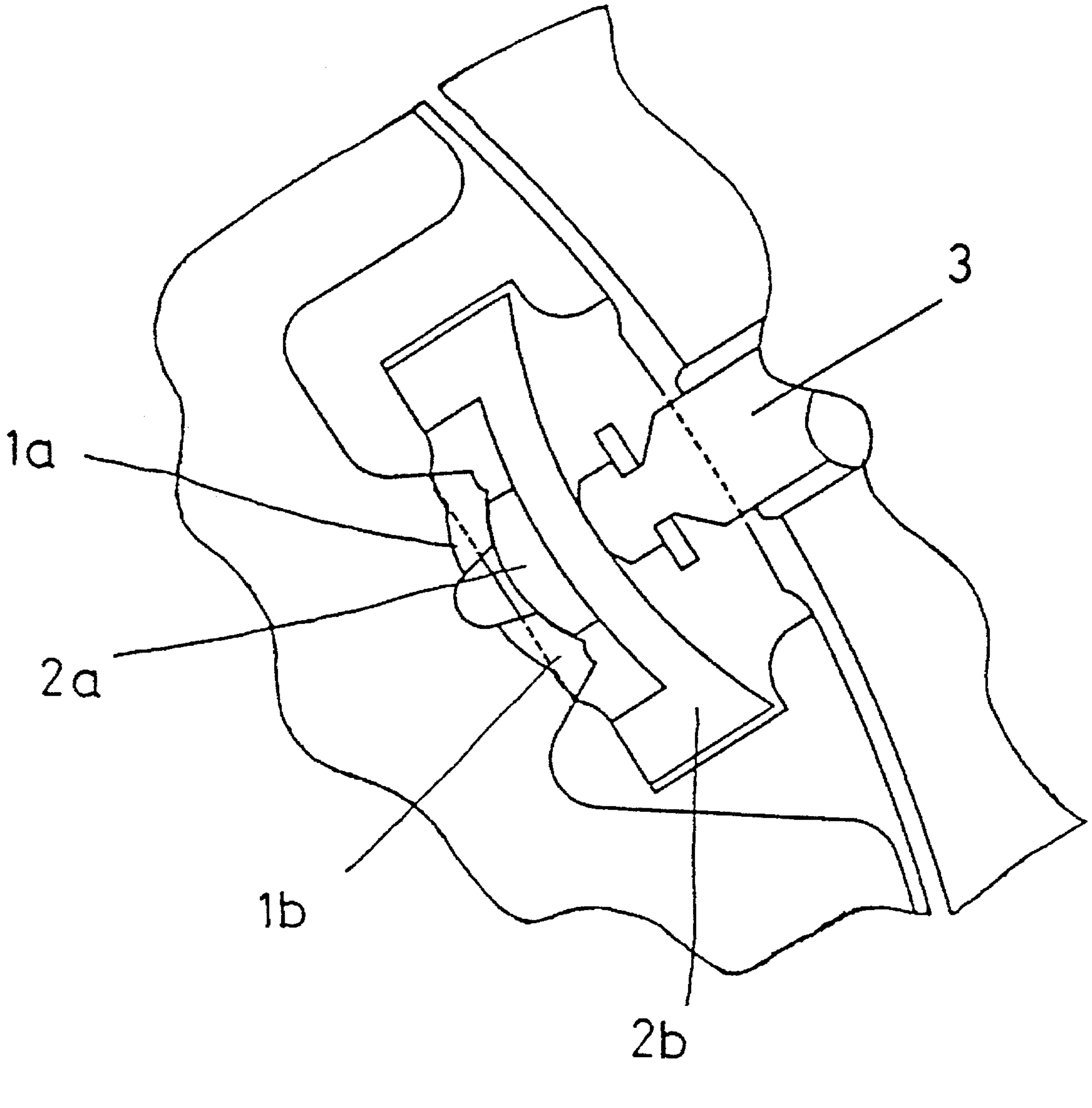
FIG. 3 is a plane view showing an operation of an embodiment of the inventive electronic apparatus having a switching mechanism.

When the switching mechanism shown in FIG. 3 is employed, a switch may be disposed at the side of an electronic apparatus without losing anti-static electricity.

Figure 8:
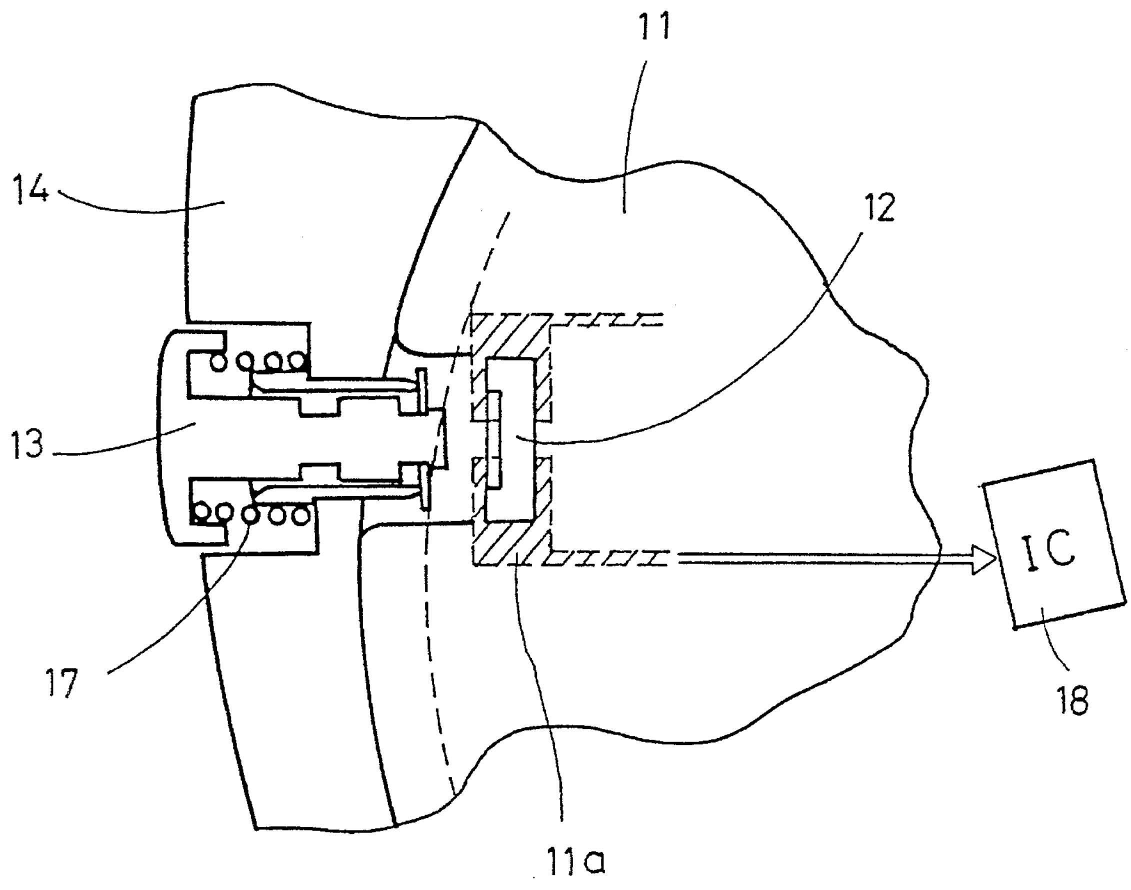
FIG. 8 PRIOR ART
FIG. 8 is a plane diagram showing a switching mechanism of a conventional electronic apparatus.
Figure 9:
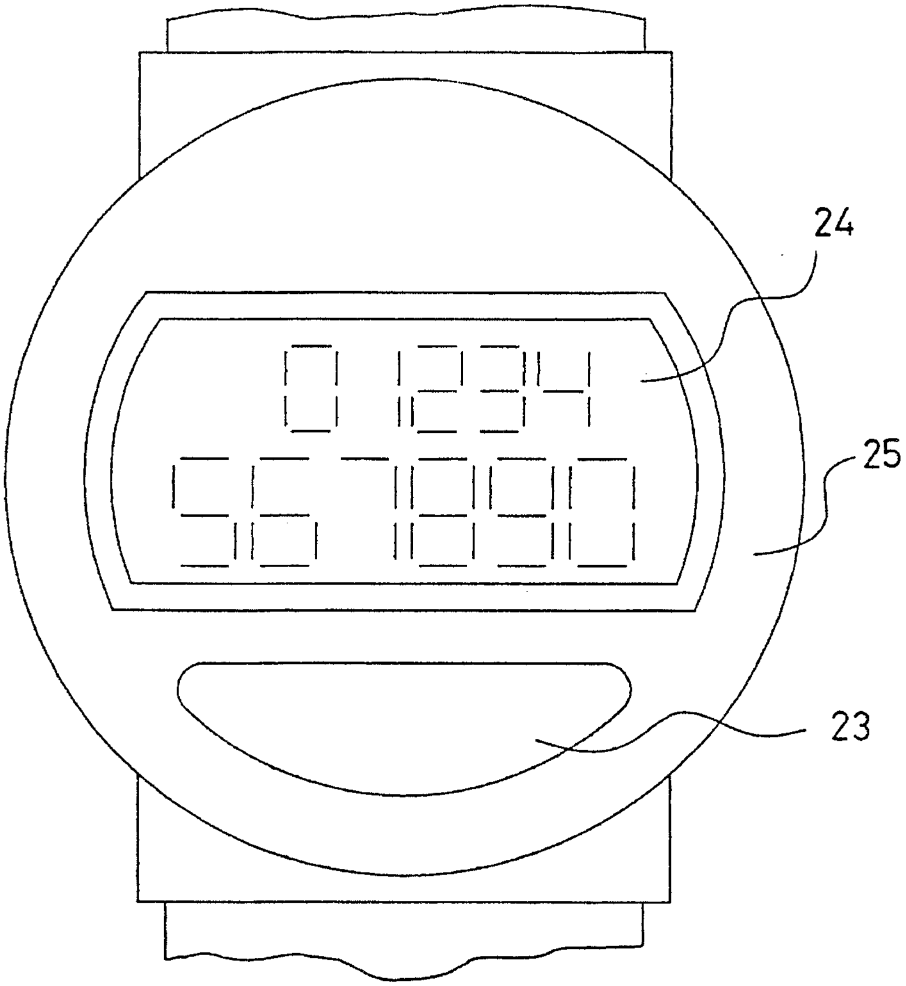
FIG. 9 PRIOR ART
FIG. 9 is a plane diagram showing a conventional electronic apparatus employing a switching mechanism.
Figure 10:
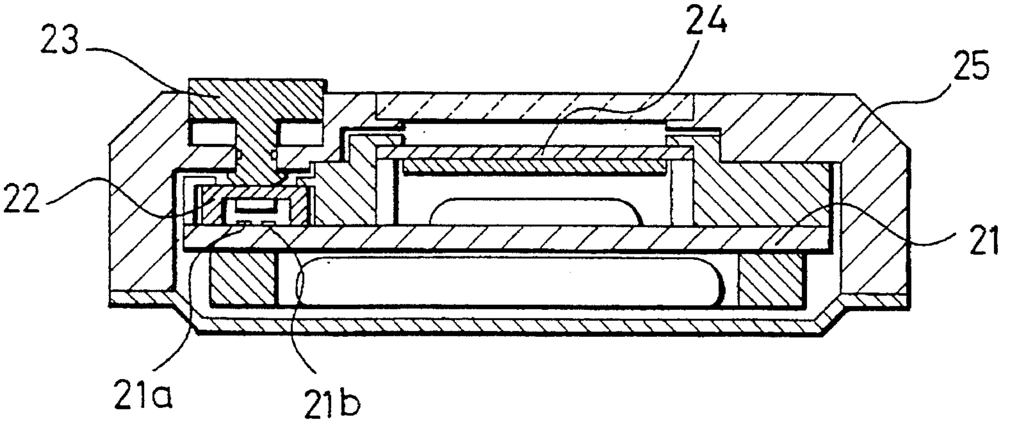
FIG. 10 PRIOR ART
FIG. 10 is a cross section showing a conventional electronic apparatus employing a switching mechanism.

In the inventive electronic apparatus having a switching mechanism, a space which is used for a switching mechanism at the front of the conventional electronic apparatus shown in FIG. 8 may be used for display elements. The display elements are set to be large in order to read displayed information easily according to the inventive electronic apparatus having a switching mechanism according to the present invention.

Figure 7:
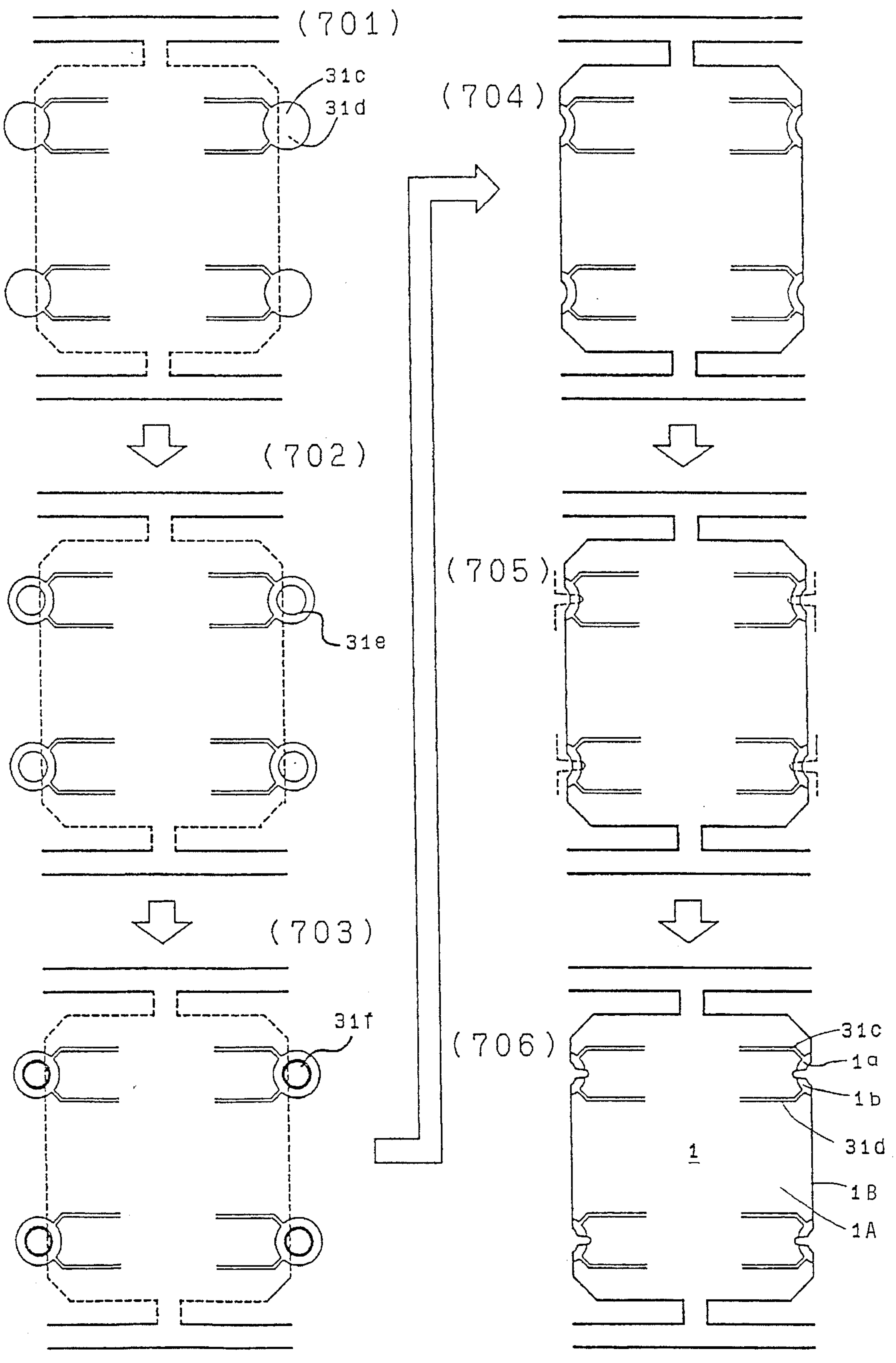
FIG. 7 is an explanatory diagram showing an embodiment of a switching section in a process of manufacturing a side pattern employed to the inventive electronic apparatus having a switching mechanism.

FIG. 7 is an explanatory diagram showing an embodiment of a switch section which is in a process of manufacturing a side pattern employed to the inventive electronic apparatus having a switching mechanism. The broken line in FIG. 7 shows an outline of the switch section when the substrate is completed.

The pattern is shaped by etching a suitable form as a pattern (Step 701).

In accordance with a shape of a side pattern, bores 31*e* are provided as through holes where plane patterns 31*c* and 31*d* are located on a main surface 1A of the substrate 1 at the right side and the left side respectively thereof (Step 702). The shape of the bore is not limited to round, but may also be a polygon, an ellipse, or a semicircle.

With electroless plating, a metal surface 31*f* is formed at the inner circumference of the bore 31*e* for a through hole, so that plane patterns 31*c* and 31*d* formed on the right side and the left side respectively are electrically combined (Step 703).

A through hole is cut with a metal mold. Then the metal surface 31*f* formed at the inner circumference of a through hole becomes a part of an outline of a substrate, and is exposed to the side of the substrate so as to be a side pattern (Step 704).

The side pattern is then cut and divided by a metal mold (Step 705).

The side pattern, and the plane patterns 31*c* and 31*d* both of which are electrically combined with the side pattern, are cut at the same time, so that they function as two wirings in the substrate (Step 706).

Other dividing methods other than the dividing method of the side pattern shown in this embodiment may be employed, such as recessing and etching.

Figure 6:
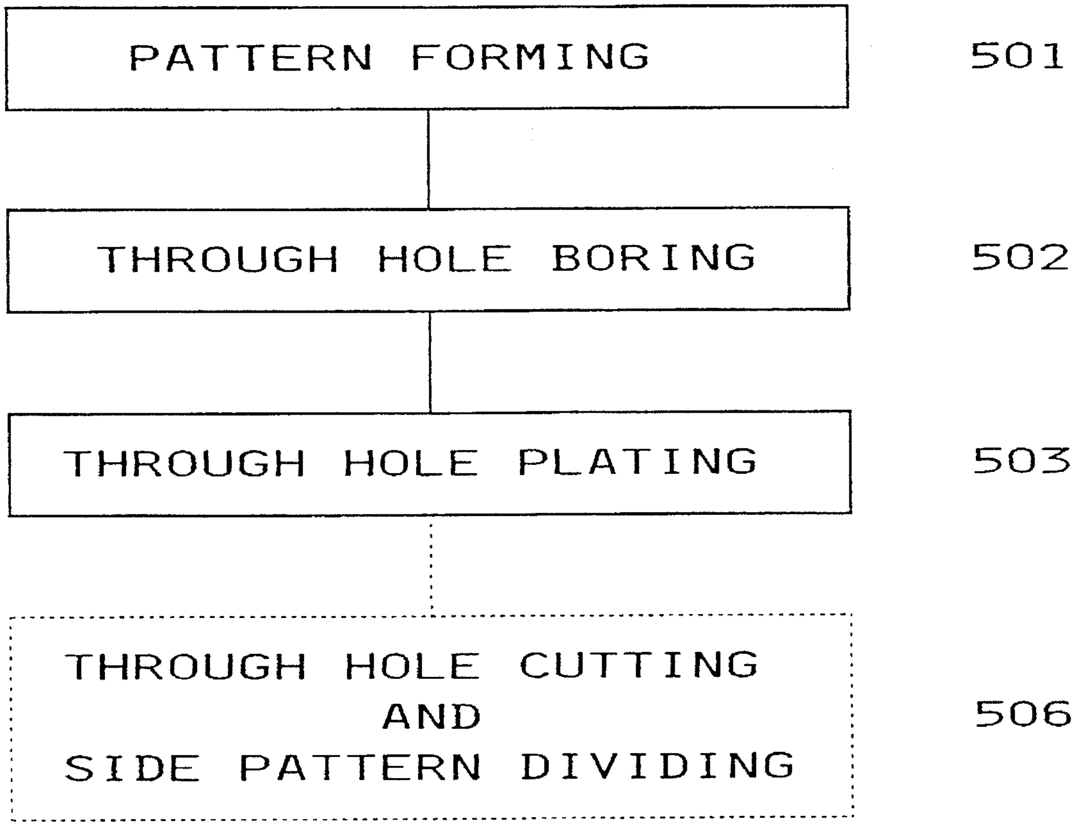
FIG. 6 is a process flow chart showing an embodiment of a manufacturing method of a substrate for the inventive electric apparatus having a switching mechanism.

FIG. 6 is a process chart showing an embodiment of the inventive manufacturing method of a substrate.

Figure 5:
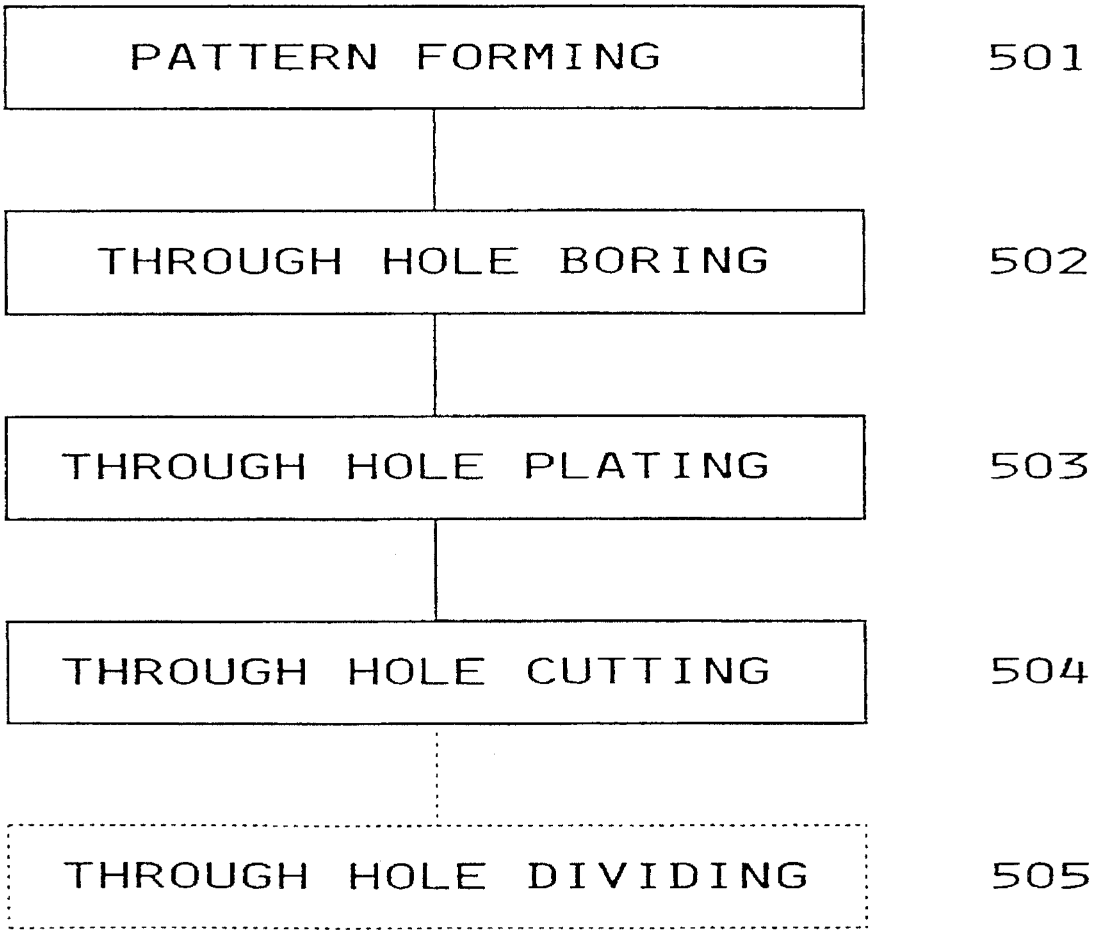
FIG. 5 is a process flow chart showing an embodiment of a manufacturing method of a side pattern in a substrate for the inventive electronic apparatus having a switching mechanism.

The process shown in FIG. 6 differs from that of FIGS. 5 and 7 in the process step (Step 506) where a cutting step for cutting a through hole is performed at the same time with a dividing step for cutting and dividing a side pattern.

According to the invention, as described above, since a dividing step is provided after forming a side pattern, the first side pattern and the second side pattern may be formed on the substrate. Therefore, according to the invention, the following effects are obtained.

When the external operating member is pressed while the static electricity is generated, the insulating member blocks the static electricity from the external operating member and then the static electricity doesn't flow into the conducting member and half-divided side patterns. As a result, the flow of the static electricity into an IC is prevented.

Since the elastic member has a shape and an elasticity coefficient suitably provided, the external operating member may be returned to the previous position. As a result, a coil spring necessary in the a prior art is not used.

According to the inventive switching mechanism, the switch may be mounted to the side of the electronic apparatus without reducing anti-static electricity of the electronic apparatus.

A space for a switch provided at the front of the electronic apparatus is not necessary, then the space may be used for display elements. As a result, the size of the display elements may become large.

What is claimed is:

1. A switching mechanism for an electronic apparatus, the switching mechanism comprising: a substrate having a main surface and a side surface; a printed wiring circuit disposed on the main surface of the substrate; a first conductive pattern disposed on the side surface of the substrate and connected to the printed wiring circuit; a second conductive pattern disposed on the side surface of the substrate and connected to the printed wiring circuit, the second conductive pattern being spaced from the first conductive pattern; an elastic member having a conducting element spaced from and facing the side surface of the substrate; and an operating member operable when depressed to effect elastic flexure of the elastic member to displace the conducting element into contact with the first and second conductive patterns on the side surface of the substrate.

2. A switching mechanism as claimed in claim 1; further comprising a case supporting the operating member; and support means fixedly attached to the case for supporting the substrate and the elastic member.

3. A switching mechanism as claimed in claim 2; wherein the case has a main surface and a side surface, the operating member being mounted on said side surface.

4. A switching mechanism as claimed in claim 3; further comprising a display member disposed on the main surface of the case.

5. A switching mechanism as claimed in claim 1; wherein the elastic member comprises an insulating member having first and second surfaces, the conducting element being fixedly attached to said first surface, and said second surface being spaced from and facing the operating member.

6. A switching mechanism as claimed in claim 1; wherein the first conductive pattern comprises a switch pattern for performing a switch function, and the second pattern comprises a ground pattern.

7. An electronic apparatus comprising: a case having a main surface and a side surface; a substrate disposed within the case and having a main surface and a side surface; a printed wiring circuit disposed on the main surface of the substrate; a first conductive pattern disposed on the side surface of the substrate and connected to the printed wiring circuit; a second conductive pattern disposed on the side surface of the substrate and connected to the printed wiring circuit, the second conductive pattern being spaced from the first conductive pattern; an elastic member having a conducting element spaced from and facing the side surface of the substrate; and an operating member mounted on the side surface of the case and operable when depressed to elastically flex the elastic member to displace the conducting element into contact with the first and second conductive patterns on the side surface of the substrate.

8. An electronic apparatus as claimed in claim 7; further comprising support means fixedly attached to the case for supporting the substrate and the elastic member.

9. An electronic apparatus as claimed in claim 7; further comprising a display member disposed on the main surface of the case.

10. An electronic apparatus as claimed in claim 7; wherein the elastic member comprises an insulating member having first and second surfaces, the conducting element being fixedly attached to said first surface, and said second surface being spaced from and facing the operating member.

11. An electronic apparatus as claimed in claim 7; wherein the first conductive pattern comprises a switch pattern for performing a switch function, and the second pattern comprises a ground pattern.

12. In a timepiece: a case having a main surface and a side surface; a substrate disposed within the case and having a main surface and a side surface; a printed wiring circuit disposed on the main surface of the substrate; a first conductive pattern disposed on the side surface of the substrate and connected to the printed wiring circuit; a second conductive pattern disposed on the side surface of the substrate and connected to the printed wiring circuit, the second conductive pattern being spaced from the first conductive pattern; an elastically flexible insulating member disposed in spaced relation from the substrate; a conducting element fixedly attached to the insulating member in facing and spaced apart relationship to the first and second conductive patterns; and an operating member mounted on the side surface of the case and operable when depressed to elastically flex the insulating member to thereby displace the conducting element into contact with the first and second conductive patterns on the side surface of the substrate.

13. A timepiece as claimed in claim 12; further comprising support means fixedly attached to the case for supporting the substrate and the insulating member.

14. A timepiece as claimed in claim 12; further comprising a display member disposed on the main surface of the case.

15. A timepiece as claimed in claim 12; wherein the first conductive pattern comprises a switch pattern for performing a switch function, and the second pattern comprises a ground pattern.

* * * * *